(12) United States Patent
Mizuno

(10) Patent No.: US 6,765,420 B2
(45) Date of Patent: Jul. 20, 2004

(54) PULSE WIDTH DETECTION CIRCUIT FILTERING THE INPUT SIGNAL AND GENERATING A BINARY SIGNAL

(75) Inventor: Nobuyasu Mizuno, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/327,094

(22) Filed: Dec. 24, 2002

(65) Prior Publication Data
US 2003/0128060 A1 Jul. 10, 2003

(30) Foreign Application Priority Data

Jan. 7, 2002 (JP) ........................................ 2002-000668

(51) Int. Cl.[7] .............................................. H03K 3/017
(52) U.S. Cl. ........................ 327/172; 327/178; 327/551
(58) Field of Search ................................ 327/172–175, 327/178, 551–559

(56) References Cited

U.S. PATENT DOCUMENTS 4,697,098 A * 9/1987 Cloke ........................... 327/79
5,397,945 A * 3/1995 Shum et al. .................. 327/77
5,923,454 A * 7/1999 Eastmond et al. .......... 398/202
6,118,567 A * 9/2000 Alameh et al. ............. 398/191

FOREIGN PATENT DOCUMENTS

TW 451064 8/2001

* cited by examiner

Primary Examiner—Minh Nguyen
(74) Attorney, Agent, or Firm—Arent Fox, PLLC

(57) ABSTRACT

A pulse width detection circuit for accurately detecting a pulse width from an input signal. The detection circuit includes a first filter circuit for receiving the input signal and generating a first processed signal. The first processed signal includes a first component having an AC component of the input signal and a second component having a low frequency component or a DC component of the input signal. A second filter circuit is electrically connected to the first filter circuit. The second filter circuit includes a high pass filter for receiving the first processed signal and generating a second processed signal. A binary conversion circuit is electrically connected to the second filter circuit to receive the second processed signal and generate the binary signal.

15 Claims, 5 Drawing Sheets

PULSE WIDTH DETECTION CIRCUIT FILTERING THE INPUT SIGNAL AND GENERATING A BINARY SIGNAL

CROSS-REFERENCE TO RELATED APPLICATIONS

This application is based upon and claims the benefit of priority of Japanese Patent Applications No. 2002-000668, filed on Jan. 7, 2002, the contents being incorporated herein by reference.

BACKGROUND OF THE INVENTION

The present invention relates to a pulse width detection circuit, a DC component cancellation circuit, and a receiving circuit.

Optical communication systems using optical fibers or infrared, which is transmitted through open space, are applied to electronic devices nowadays. In an optical communication system, the receiving circuit receives light, converts the received light to an electric signal, and amplifies the electric signal. The receiving circuit further generates a binary receiving signal from the electric signal. To improve the receiving accuracy, the receiving signal must be generated so that it accurately corresponds to the input signal (received light).

In the prior art, the receiving circuit of an optical communication system includes multiple stages of amplifiers to amplify input signals, which amplitudes are extremely small. The amplitude of an input signal becomes smaller as the distance between a light source and a light receiving device increases. The multiple stages of amplifiers have a total gain that is required to generate a receiving signal from input signals having amplitudes (IPD), for example, between about 100 nA and 10 mA. The receiving circuit generates the binary receiving signal from the amplified signal in accordance with a predetermined threshold voltage.

The receiving circuit includes a filter (differentiation) circuit to extract an edge of the input signal. The filter circuit is arranged between the amplifiers. The receiving circuit generates a pulse signal, which corresponds to the edge position of the input signal, with the filter circuit and amplifies the pulse signal with the amplifiers. The receiving circuit employs the filter circuit to generate the receiving signal with a pulse width that is substantially the same as that of the input signal.

The input signal, which amplitude is large, has a waveform that includes a gradual trailing portion. The amplifiers also amplify the gradual trailing portion. Referring to FIG. 1, in accordance with a threshold value, an input signal having a small amplitude is amplified to generate an amplified signal Sa, and an input signal having a large amplitude is amplified to generate an amplified signal Sb. A binary receiving signal RX is generated from the amplified signal Sa and the amplified signal Sb. The amplified signal has a gradual trailing portion. Accordingly, the receiving signal RX generated from the amplified signal Sb (shown by broken lines) is greater than the pulse signal of the receiving signal RX generated from the amplified signal Sa (shown by solid line).

The filter circuit generates a signal having a first pulse, which corresponds to a rising edge of the input signal, and a second pulse, which corresponds to a trailing edge of the input signal. The waveforms of the rising edge of the first pulse and the trailing edge of the second pulse do not change much even when they are amplified. Accordingly, the receiving circuit uses the rising edge of the first pulse and the trailing edge of the second pulse to generate the receiving signal RX, the pulse signal of which is substantially the same as the input signal.

The filter circuit functions to cancel the offset voltage of the amplifiers. When the multiple stages of amplifiers are connected in series, the output signal of the final stage amplifier includes a DC component that is generated by amplifying the offset voltage of each amplifier. The DC component hinders the generation of an accurate binary receiving signal RX. When the DC component exceeds a threshold value, the receiving circuit generates the receiving signal RX at a constant level (high level). Thus, when amplifying an extremely small input signal (received light), a plurality of filter circuits are employed to eliminate the DC component generated by the amplifiers.

Each filter circuit is a high pass filter (HPF), which eliminates predetermined frequency components of the input signal (e.g., DC component or component from DC to frequency lower than a communication frequency). Accordingly, each of the filter circuits connected between the amplifiers eliminates the effects of the offset voltage of the amplifier in the previous stage.

However, when generating the receiving signal RX using a plurality of filter (differentiation) circuits, the receiving signal RX may be generated erroneously from the input signal Sin, as shown in FIG. 2. A first filter circuit generates a first processed signal S1 in accordance with the input signal Sin. A second filter circuit generates a second processed signal S2 in accordance with the first processed signal S1. The second processed signal S2 includes pulses P1 and P2, which respectively correspond to the rising edge and trailing edge of the first processed signal S1. Accordingly, when the second processed signal S2 is compared with a threshold voltage, the receiving signal RX goes high during the period between the first pulse P1 and the second pulse P2 and after the fourth pulse P4.

In an optical communication system that receives a signal light through open space, a light receiving device receives, for example, solar light together with the signal light. The light receiving device generates a receiving current, which is included in the DC component that results from the solar light. The DC component resulting from the solar light hinders the generation of an accurate receiving signal in the same manner as the offset voltage of the amplifiers.

Thus, the receiving circuit includes a DC cancellation circuit, which is connected between the input and output terminals of the initial stage amplifier (preamplifier). In accordance with the output voltage of the preamplifier, the DC component cancellation circuit generates a cancellation current to cancel the DC component of the current that is input to the preamplifier and feeds back the cancellation current to the input of the preamplifier.

Referring to FIGS. 3A and 3B, the prior art integration type DC component cancellation circuit and the prior art DC component cancellation circuit incorporating a low pass filter (LPF) causes a peak level of an input signal Vin to approach a reference voltage Vref and cancels a DC offset. However, when the input signal Vin continues for a long period of time, the output signal Vout is offset in a direct current manner and increased, as shown in FIG. 3C. This is because the prior art DC component cancellation circuit approximates the average value level of the input signal Vin with the reference voltage Vref. Another reason is in that, as shown in FIG. 4, the average value of the input signal Vin (shown by broken lines) fluctuates (decreases).

SUMMARY OF THE INVENTION

It is an object of the present invention to provide a pulse detection circuit that accurately detects the pulse width from the input signal. A further object of the present invention is to provide a current component cancellation circuit that accurately cancels a DC component. A further object of the present invention is to provide a receiving circuit that generates a receiving signal having a pulse width that accurately corresponds with the pulse width of a receiving current.

To achieve the above objects, the present invention provides a pulse width detection circuit for detecting a pulse width of an input signal and generating a binary signal having a pulse width corresponding to the pulse width of the input signal. The detection circuit includes a first filter circuit for receiving the input signal and generating a first processed signal. The first processed signal includes a first component having an AC component of the input signal and a second component having a low frequency component or a DC component of the input signal. A second filter circuit is electrically connected to the first filter circuit. The second filter circuit includes a high pass filter for receiving the first processed signal and generating a second processed signal. A binary conversion circuit is electrically connected to the second filter circuit. The binary conversion circuit receives the second processed signal and generates the binary signal.

A further perspective of the present invention is a method for detecting a pulse width of an input signal. The method includes generating a filtered signal by filtering the input signal with a first high pass filter, generating a first processed signal by adding a low frequency component or a DC component of the input signal to the filtered signal, generating a second processed signal by filtering the first processed signal with a second high pass filter, and generating a binary signal with the second processed signal.

A further perspective of the present invention is a receiving circuit including a first amplifier for converting a receiving current to a voltage signal and a first filter circuit connected to the first amplifier to generate a first processed signal in accordance with the voltage signal. The first processed signal includes a first component having an AC component of the voltage signal and a second component having a low frequency component or a DC component of the voltage signal. A second filter circuit is electrically connected to the first filter circuit. The second filter circuit includes a high pass filter for receiving the first processed signal and generating a second processed signal. A binary conversion circuit is electrically connected to the second filter circuit to receive the second processed signal and generate a binary signal.

A further perspective of the present invention is a DC component cancellation circuit connected to an input terminal and an output terminal of an amplifier that amplifies an input signal and generates an amplified signal. The cancellation circuit eliminates an offset voltage included in the input signal. The cancellation circuit includes a voltage holding circuit for receiving the amplified signal and holding a peak voltage of the amplified signal. A feedback amplifier is connected to the voltage holding circuit. The feedback amplifier compares the held peak voltage with a reference voltage and generates a feedback signal to eliminate the offset voltage. The feedback signal is provided to the input terminal of the first amplifier.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
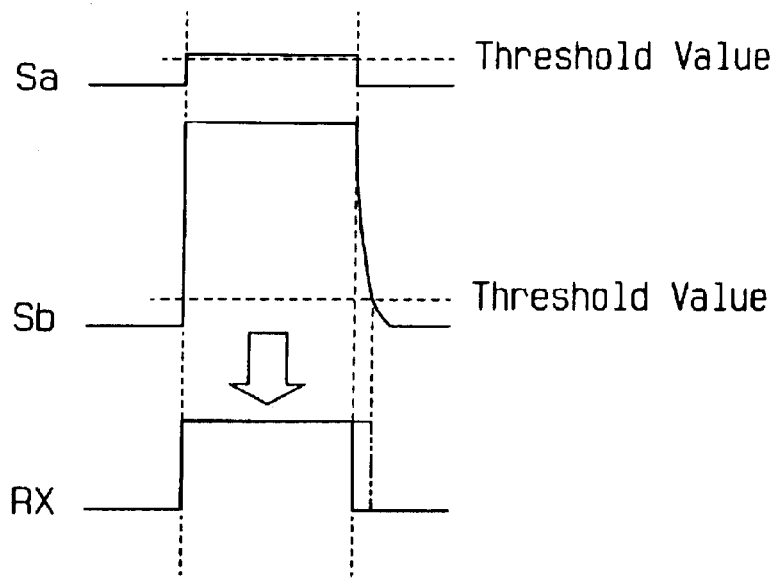
FIG. 1 is a diagram illustrating the waveforms of an input signal and an output signal in the prior art.
Figure 2:
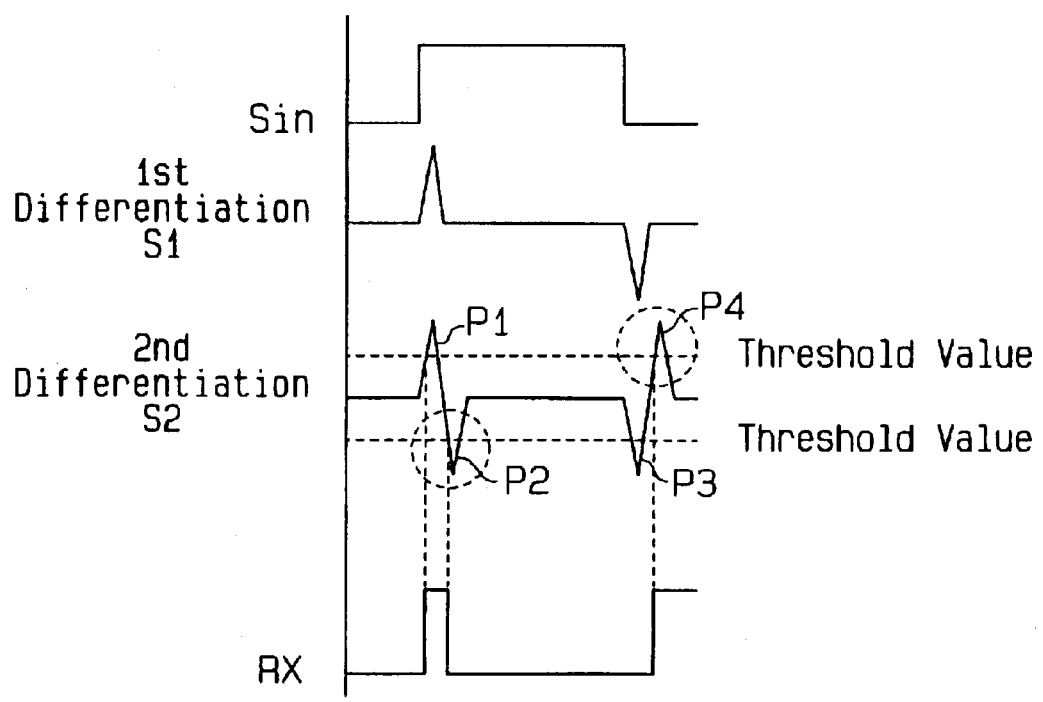
FIGS. 2 to 4 are diagrams illustrating the waveforms of a pulse width detection circuit in the prior art.
Figure 3A:
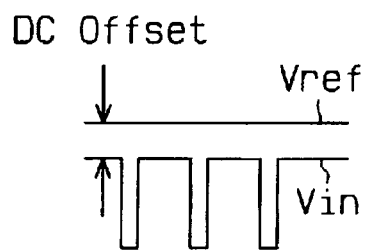
Figure 3B:
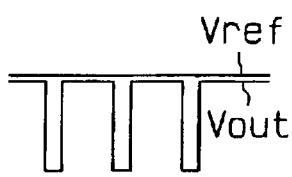
Figure 3C:
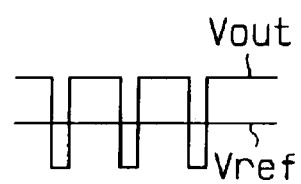
Figure 4:
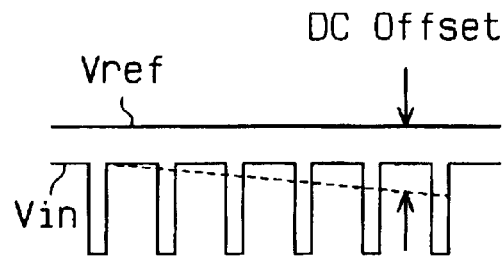

In the drawings, like numerals are used for like elements throughout.

Figure 5A:
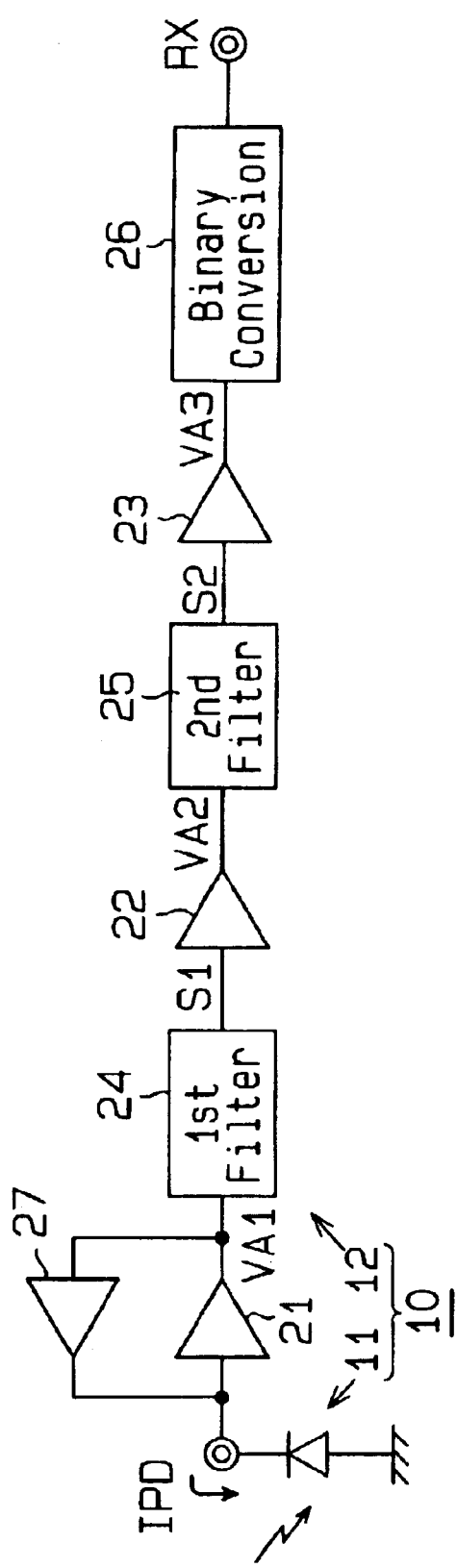
FIG. 5A is a schematic block circuit diagram of a pulse width detection circuit according to a preferred embodiment of the present invention.

FIG. 5A is a schematic block diagram of sections related to the receiving of signals in an optical communication device 10. The optical communication device 10 includes a photodiode (PD) 11 and a receiving circuit 12.

The photodiode 11 generates a receiving current IPD, which corresponds to the received light. The receiving circuit 12 converts the voltage of the receiving current IPD to generate a receiving voltage and generates a binary receiving signal RX from the receiving voltage.

The receiving circuit 12 includes a plurality of (three in the preferred embodiment) amplifiers 21, 22, 23, a first filter circuit 24, a second filter circuit 25, and a binary conversion circuit 26.

The photodiode 11 is connected to the input terminal of the first (initial stage) amplifier 21. The first amplifier 21 receives the receiving current IPD, which is generated by the photodiode 11, and converts the receiving current IPD to a first amplified signal (voltage signal) VA1.

The first, second, and third amplifiers 21–23 are connected in series. The first filter circuit 24 is connected between the first and second amplifiers 21, 22. The second filter circuit 25 is connected between the second and third amplifiers 22, 23.

The first filter circuit 24 generates a first processed signal S1 in accordance with the first amplified signal VA1.

The second amplifier 22 amplifies the first processed signal S1 and generates a second amplified signal VA2. The second filter circuit 25 receives the second amplified signal VA2 and generates a second processed signal S2 in accordance with the second amplified signal VA2.

The third amplifier 23 amplifies the second processed signal S2 and generates a third amplified signal VA3. The binary conversion circuit 26 is connected to the output terminal of the third amplifier VA3.

The binary conversion circuit 26 generates a binary receiving signal RX from the third amplified signal VA3. The binary conversion circuit 26 includes, for example, a comparator (not shown), and compares the third amplified signal VA3 with a predetermined threshold voltage to generate the receiving signal RX.

The pulse width of the receiving signal RX is substantially the same as the pulse width of the input signal (in the preferred embodiment, the receiving current IPD). That is, the receiving circuit 12 is a pulse width detection circuit that detects the pulse width of the input signal IPD and generates an output signal (in the preferred embodiment, the receiving signal RX) that is in accordance with the pulse width.

The total gain of the first, second, and third amplifiers 21–23 are set so that the receiving signal RX is generated in response to a plurality of input signals having different amplitudes. The amplitude of the receiving current IPD corresponds to the distance of the open space in which communication is enabled in the apparatus incorporating the optical communication device. The amplitude of the receiving current IPD becomes smaller as the distance between devices increases. Accordingly, the total gain is set so that the third amplified signal VA3 exceeds the threshold value of the binary conversion circuit 26 when the amplitude of the receiving current IPD exceeds the threshold voltage of the binary conversion circuit 26 to enable communication between devices in a predetermined area of open space.

A DC component cancellation circuit 27 is connected between the input and output terminals of the first amplifier 21. The input terminal of the DC component cancellation circuit 27 is connected to the output terminal of the first amplifier 21. The output terminal of the DC component cancellation circuit 27 is connected to the input terminal of the first amplifier 21.

The DC component cancellation circuit 27 is used to cancel the effects of the DC component included in the receiving current that flows through the photodiode 11 due to, for example, DC light of solar light. The DC light refers to light that generates the DC component of the receiving current IPD. The DC component includes frequency components that are lower than the frequency band used for communication. In accordance with the DC component included in the first amplified signal VA1, the DC component cancellation circuit 27 generates current that cancels the DC component and feeds back the current to the input of the first amplifier 21.

Figure 5B:
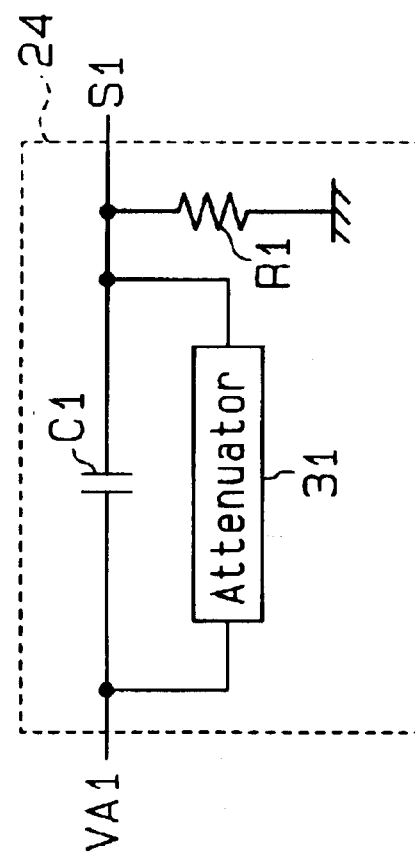
FIG. 5B is a schematic circuit diagram of a first filter circuit in the pulse width detection circuit of FIG. 5A.

The first and second filter circuits 24, 25 will now be discussed. FIG. 5B is a schematic circuit diagram of the first filter circuit 24.

The first filter circuit 24 includes a high pass filter (HPF) and an attenuator (bypass circuit) 31. The HPF includes a capacitor C1 and a resistor R1. A first terminal of the capacitor C1 is provided with a first amplified signal VA1 and a second terminal of the capacitor C1 is connected to a first terminal of the resistor R1. A second terminal of the resistor R1 is connected to a low potential power supply (e.g., ground) The attenuator 31 is connected parallel to the capacitor C1. The first filter circuit 24 outputs the first processed signal S1 from a node between the capacitor C1 and the resistor R1.

The capacitor C1 of the first filter circuit 24 is connected in series between the first and second amplifiers 21, 22, as shown in FIG. 5A. The capacitor C1 and the resistor R1 enable the passage of the AC components of the first amplified signal VA1 provided from the first amplifier VA1, eliminate the DC components, and generate a filtered signal. The attenuator 31 attenuates a low frequency component or a DC component of the first amplified signal VA1 and generates an attenuated signal. The attenuator 31 is, for example, a resistor. The first processed signal S1 is generated by adding the filtered signal and the attenuated signal.

Accordingly, the first processed signal S1 includes a first component, which is equivalent to an AC signal that is generated when an AC component included in the first amplified signal VA1 passes through the high pass filter (HPF), and a second component (low frequency component or DC component), which is related with a low frequency component or DC component that is included in the first amplified signal VA1.

Figure 6:
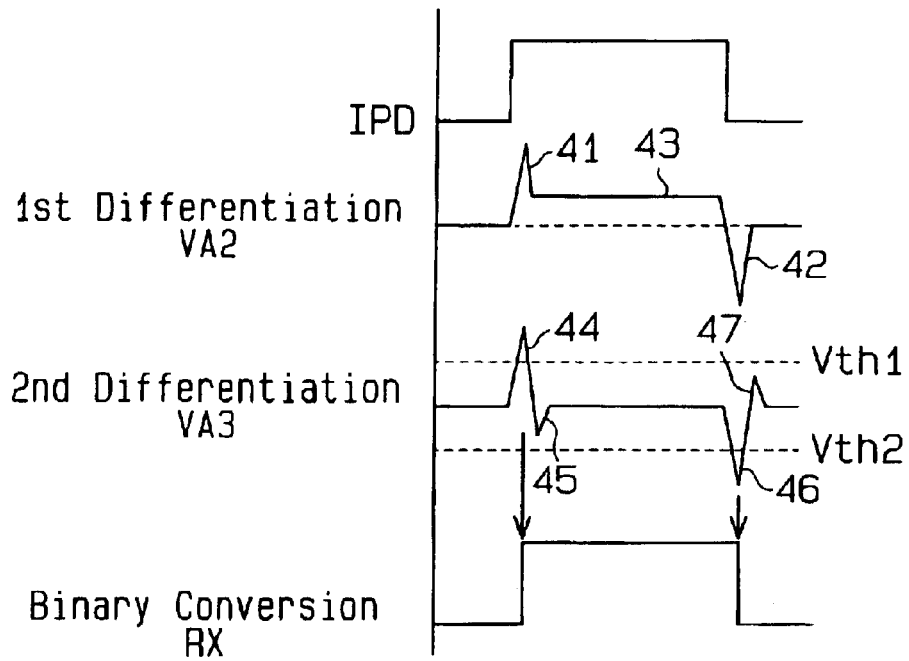
FIG. 6 is a waveform diagram of the pulse width detection circuit of FIG. 5A.

The first processed signal S1 has a waveform obtained by adding the low frequency component or DC component included in the first amplified signal VA1 to a signal waveform of the first amplified signal VA1 that passes through the high pass filter (FIG. 6).

The second filter circuit 25 is a normal high pass filter and includes, for example, a capacitor and a resistor. The second filter circuit 25 eliminates signals that are less than or equal to a predetermined frequency from the second amplified signal VA2 and generates a second processed signal S2.

The loss of the attenuator 31, which is included in the first filter circuit 24, is set taking into consideration the gain of the latter stage amplifiers (second amplifier 22 and third amplifier 23) so that an erroneous operation does not occur. More specifically, the loss of the attenuator 31 is set so that the second processed signal S2 does not exceed the threshold voltage of the binary conversion circuit 26 at unintended locations. For example, when the gains of the first to third amplifiers 21–23 are each ten times, the total gain of the attenuator 31 and the second amplifier 22 relative to the AC component of the first amplified signal VA1 is ten times. Thus, the loss of the attenuator 31 (the resistance when the attenuator is configured by a resistor) is set so that the gain of the second amplifier 22 relative to the low frequency component or DC component of the first amplified signal VA1 is one to two times.

The operations of the first and second filter circuits 24, 25 will now be discussed with reference to FIG. 6. The second and third amplifiers 22, 23 amplify the output signals of the first and second filter circuits 24, 25, respectively. Accordingly, FIG. 6 shows the waveforms of the amplified second and third amplifiers 22, 23 in lieu of the first and second processed signals S1, S2.

The first filter circuit 24 adds the first component (AC component) to the second component (low frequency component or DC component) to generate the first processed signal S1. The waveform of the first processed signal S1 includes signal portions 41, 42 of the first amplified signal VA1 and a low frequency component or DC component portion 43. The low frequency component or DC component portion 43 causes the amplitude of the signal portions 41, 42 to appear small. For example, in the signal portion 41 corresponding to the rising edge of the first amplified signal VA1, the amplitude of the trailing edge is relatively smaller than the rising edge of the first amplified signal VA1. In the signal portion 42 corresponding to the trailing edge of the first amplified signal VA1, the amplitude of the rising edge is relatively smaller than the amplitude of the trailing edge.

In the second filter circuit 25, the second processed signal S2 is generated when the first processed signal S1 (actually, the second amplified signal VA2) passes through the high pass filter. The amplitude of the second processed signal S2 corresponds to the amplitude of the input signal. The amplitude of a peak 44, which corresponds to the rising edge of the signal portion 41 of the first processed signal S1 is greater than the amplitude of a peak 45, which corresponds to a trailing edge of the first processed signal S1. The peak 44 is greater than a first threshold voltage Vth1, which is used to detect the input rising edge of the binary conversion circuit 26. The peak 45 is greater than a second threshold voltage Vth2, which is used to detect the trailing edge.

A peak 46, which corresponds to the trailing edge of the signal portion 42, is less than the second threshold voltage Vth2. A peak 47, which corresponds to the rising edge of the signal portion 42 is less than the first threshold voltage Vth1.

In accordance with the third amplified signal VA3, which is generated by amplifying the signal differentiated for a second time (second processed signal S2) with the third amplifier 23, the binary conversion circuit 26 generates the receiving signal RX, which is substantially accurate and has a pulse width that is substantially the same as the pulse width of the receiving current IPD.

The DC component cancellation circuit 27 will now be discussed.

Figure 7:
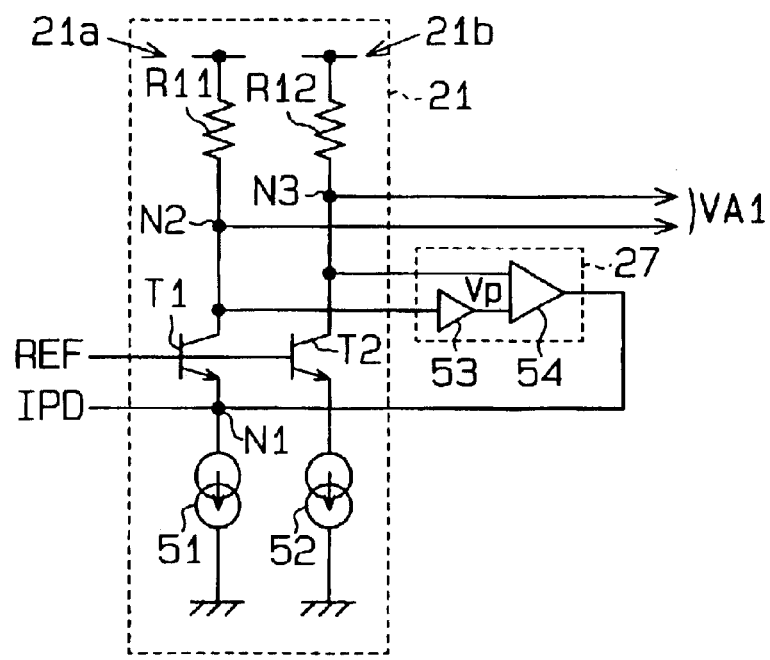
FIG. 7 is a schematic circuit diagram of a DC component cancellation circuit in the pulse width detection circuit of FIG. 5A.

FIG. 7 is a schematic circuit diagram of the first amplifier 21 and the DC component cancellation circuit 27. The first amplifier 21 includes a current voltage conversion circuit 21a and a reference voltage generation circuit 21b. The current voltage conversion circuit 21a includes a first resistor R11, a first transistor T1, and a first current source 51. The reference voltage generation circuit 21b includes a second resistor R12, a second transistor T2, and a second current source 52.

The first and second resistors R11, R12 each have a first terminal connected to a high potential power source. A second terminal of the first resistor R11 is connected to the first transistor T1, and a second terminal of the second resistor R12 is connected to the second transistor T2. The first and second transistors T1, T2 are preferably NPN transistors. The collectors of the transistors T1, T2 are connected to the first and second resistors R11, R12, respectively. The emitters of the transistors T1, T2 are connected to the first and second current sources 51, 52, respectively. The bases of the transistors T1, T2 receive the same reference signal REF.

The first and second current sources 51, 52 have first terminals respectively connected to the first and second transistors T1, T2 and second terminals connected to the low potential power supply.

A first node N1 between the first transistor T1 and the first current source is provided with the input signal (receiving current) IPD. The first amplifier 21 outputs the first amplified signal VA1 from a second node N2 between the first resistor R11 and the first transistor T1.

The first resistor R11 and the second resistor R12 have substantially the same resistance. The first transistor T1 and the second transistor T2 have substantially the same electric characteristic. The first current source 51 and the second current source 52 generate current having substantially the same value.

The bases of the first and second transistors T1, T2 receive the same reference signal REF. Accordingly, when the current value of the receiving current IPD provided to the first node N1 is 0 (zero), the potentials at the second and third nodes N2, N3 are substantially the same.

The first resistor R11, the first transistor T1, and the first current source 51 (i.e., current voltage conversion circuit 21a) change the potential at the second node N2 in accordance with the receiving current IPD.

The current component cancellation circuit includes a peak hold circuit (voltage holding circuit) 53 and an amplifier 54. The input terminal of the peak hold circuit 53 is connected to the second node N2, and the output terminal of the peak hold circuit 53 is connected to the amplifier 54. The amplifier 54 has a first input terminal connected to the third node N3, a second input terminal connected to the peak hold circuit 53, and an output terminal connected to the first node N1.

The peak hold circuit 53 has a capacitor (not shown) that stores charges in accordance with the potential at the second node N2. The peak hold circuit 53 generates a holding signal Vp having a peak level of the potential at the second node.

The amplifier 54 generates feedback current in accordance with the potential difference between the two input terminals. The amplifier 54 provides the first node N1 (i.e., the input of the first amplifier) with feedback current and functions to decrease the potential difference between the two input terminals.

The operation of the DC component cancellation circuit 27 will now be discussed.

Figure 8:
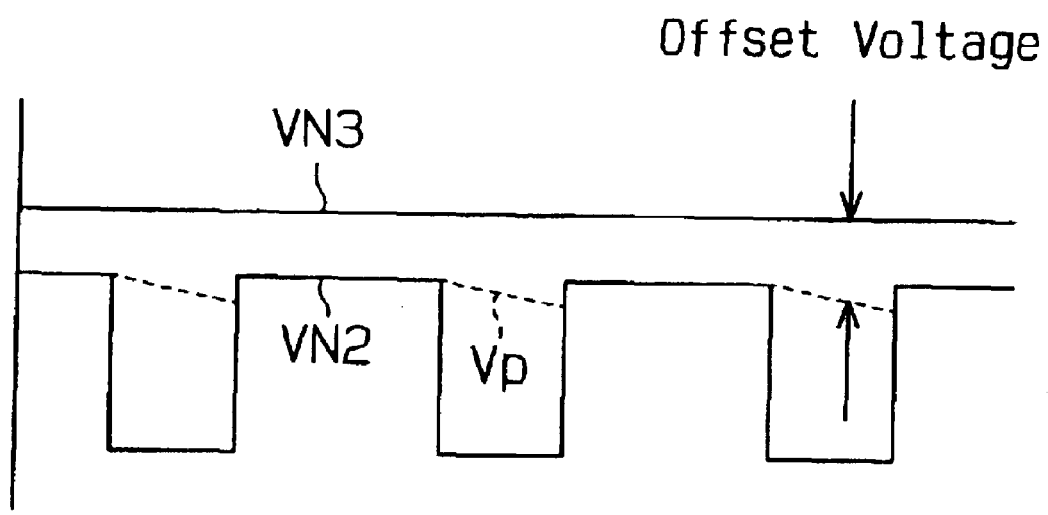
FIG. 8 is a waveform diagram of the DC component cancellation circuit of FIG. 7.

The potential VN2 at the second node N2 fluctuates in a pulse-like manner in accordance with the input signal (receiving current) IPD as shown by the solid line in FIG. 8. The potential VN3 at the third node N3 is constant in accordance with the reference signal REF. The potential difference between the peak level of the potential VN2 at the second node N2 and the potential VN3 at the third node N3 corresponds to the offset level.

The peak hold circuit 53 holds the peak level of the potential VN2 and generates the holding signal Vp, which fluctuates, as shown by the broken lines in FIG. 8. The fluctuation width of the holding signal Vp is much smaller than the fluctuation width of the potential VN2. The average value level of the holding signal Vp is substantially the same as the peak level of potential Vn2.

The amplifier 54 functions to cancel (nullify) the potential difference between the potential VN3 and the average value level of the holding signal Vp. Accordingly, the DC component cancellation circuit 27 causes the peak level of the potential VN2 to be substantially the same as the potential VN3 and accurately cancels the offset level of the input signal (the DC component of the receiving current IPD).

The receiving circuit (pulse width detection circuit) 12 of the preferred embodiment has the advantages described below.

(1) The first filter circuit 24 generates the first processed signal S1, which includes the filtered signal (first component) and the attenuated signal (second component). The first component is equivalent to the signal generated when the first amplified signal (voltage signal) VA1 passes through the HP filter. The second component includes a low frequency component or DC component of the first amplified signal VA1. The second filter circuit 25, which is a high pass filter, generates the second processed signal S2 in accordance with the second amplified signal VA2, which is the amplified first processed signal S1. The binary conversion circuit 26 generates the receiving signal RX from the third amplified signal VA3, which is the amplified second processed signal S2. As a result, the receiving signal RX is generated with a pulse width that is substantially the same as the pulse width of the receiving current IPD.

(2) The receiving circuit 12 includes the multiple stages of the amplifiers 21–23. The first and second filter circuits 24, 25 are connected between the amplifiers 21–23. As a result, the necessary signal is amplified.

(3) The DC component cancellation circuit 27 includes the peak hold circuit 53 and the amplifier 54. The peak hold circuit 53 generates the holding signal (voltage) Vp, which holds the peak voltage of the first amplified signal VA1 that is provided from the first amplifier 21. The amplifier 54 compares the holding voltage Vp and the reference voltage (voltage VN3 of the third node N3), cancels the potential difference between the input terminals of the amplifier 54, and generates a feedback current. The feedback current is returned to the input terminal of the first amplifier 21. The fluctuation of the average level of the holding voltage Vp relative to the elapses time is small. Thus, the DC component of the receiving current IPD is accurately canceled.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

The present invention may be embodied in a receiving circuit that receives a signal light through an optical fiber. Further, the present invention may be embodied in a receiving circuit that generates a receiving signal from a signal receiving through a means other than light.

The present invention may be applied as a pulse width detection circuit in other systems.

The receiving circuit 12 may be changed as required. For example, in an optical communication system using optical fibers, the photodiode 11 does not receive, for example, solar light. Thus, the DC component cancellation circuit 27 cannot be eliminated.

The locations of the first and second filter circuits 24, 25 may be changed when necessary.

The receiving circuit may include sets of the first and second filter circuits 24, 25.

The present examples and embodiments are to be considered as illustrative and not restrictive, and the invention is not to be limited to the details given herein, but may be modified within the scope and equivalence of the appended claims.

What is claimed is:

1. A pulse width detection circuit for detecting a pulse width of an input signal and generating a binary signal having a pulse width corresponding to the pulse width of the input signal, the detection circuit comprising:
   a first filter circuit for receiving the input signal and generating a first processed signal, wherein the first processed signal includes a first component having an AC component of the input signal and a second component having a low frequency component or a DC component of the input signal, and wherein the first filter circuit attenuates the low frequency component or DC component of the input signal to generate the second component;
   a second filter circuit electrically connected to the first filter circuit, wherein the second filter circuit includes a high pass filter for receiving the first processed signal and generating a second processed signal; and
   a binary conversion circuit electrically connected to the second filter circuit, wherein the binary conversion circuit receives the second processed signal and generates the binary signal.

2. The pulse width detection circuit according to claim 1 further comprising:
   a first amplifier connected to the first filter circuit;
   a second amplifier connected between the first and second filter circuits; and
   a third amplifier connected to the second filter circuit.

3. The pulse width detection circuit according to claim 1, wherein the first filter circuit includes a high pass filter for filtering the input signal and generating a filtered signal.

4. The pulse width detection circuit according to claim 1, wherein the first filter circuit includes a bypass circuit for attenuating the low frequency component or DC component of the input signal.

5. The pulse width detection circuit according to claim 4, wherein the bypass circuit is an attenuator.

6. A pulse width detection circuit for detecting a pulse width of an input signal and generating a binary signal having a pulse width corresponding to the pulse width of the input signal, the detection circuit
   a first amplifier receiving an input signal and amplifying the input signal to generate an amplified input signal;
   a first filter circuit connected to the first amplifier, for receiving the amplified input signal and generating a first processed signal, wherein the first processed signal includes a first component having an AC component of the input signal and a second component having a low frequency component or a DC component of the input signal;
   a second amplifier connected to the first filter circuit;
   a second filter circuit electrically connected to the second amplifier, wherein the second filter circuit includes a high pass filter for receiving the first processed signal via the second amplifier and generating a second processed signal;
   a third amplifier connected to the second filter circuit; and
   a binary conversion circuit electrically connected to the third amplifier circuit, wherein the binary conversion circuit receives the second processed signal via the third amplifier and generates the binary signal, the pulse width detection circuit further comprising:
   a DC component cancellation circuit connected between an input terminal and an output terminal of the first amplifier to eliminate an offset voltage from the input signal, wherein the cancellation circuit includes;
     a voltage holding circuit for receiving the amplified input signal and holding a peak voltage of the amplified input signal; and
     a feedback amplifier connected to the voltage holding circuit, wherein the feedback amplifier compares the held peak voltage with a reference voltage and generates a feedback signal to eliminate the offset voltage, the feedback signal being provided to the input terminal of the first amplifier.

7. A pulse width detection circuit for detecting a pulse width of an input signal and generating a binary signal having a pulse width corresponding to the pulse width of the input signal, the detection circuit comprising:
   a first filter circuit for receiving the input signal and generating a first processed signal, wherein the first processed signal includes a first component having an AC component of the input signal and a second component having a low frequency component or a DC component of the input signal;
   a second filter circuit electrically connected to the first filter circuit, wherein the second filter circuit includes a high pass filter for receiving the first processed signal and generating a second processed signal; and
   a binary conversion circuit electrically connected to the second filter circuit, wherein the binary conversion circuit receives the second processed signal and generates the binary signal, wherein the first filter circuit includes a bypass circuit for attenuating the low frequency component or DC component of the input signal wherein the bypass circuit is an attenuator, and wherein the attenuator is a resistor.

8. A method for detecting a pulse width of an input signal, the method comprising the steps of:

generating an attenuated input signal by attenuating a low frequency component or a DC component of the input signal;

generating a filtered signal by filtering the input signal with a first high pass filter;

generating a first processed signal by adding the attenuated low frequency component or the attenuated DC component of the attenuated input signal to the filtered signal;

generating a second processed signal by filtering the first processed signal with a second high pass filter; and generating a binary signal with the second processed signal.

9. The method according to claim 8, further comprising the step of:

generating an amplified first processed signal by amplifying the first processed signal; and generating an amplified second processed signal by amplifying the second processed signal.

10. A method for detecting a pulse width of an input signal, the method comprising the steps of:

generating a filtered signal by filtering the input signal with a first high pass filter;

generating a first processed signal by adding a low frequency component or a DC component of the input signal to the filtered signal;

generating a second processed signal by filtering the first processed signal with a second high pass filter; and generating a binary signal with the second processed signal, wherein the step for generating the binary signal includes comparing the second processed signal with two predetermined threshold values to generate the binary signal.

11. A receiving circuit comprising:

a first amplifier for converting a receiving current to a voltage signal;

a first filter circuit connected to the first amplifier to generate a first processed signal in accordance with the voltage signal, wherein the first processed signal includes a first component having an AC component of the voltage signal and a second component having a low frequency component or a DC component of the voltage signal, and wherein the first filter circuit attenuates the low frequency component or DC component of the voltage signal to generate the second component;

a second filter circuit electrically connected to the first filter circuit, wherein the second filter circuit includes a high pass filter for receiving the first processed signal and generating a second processed signal; and a binary conversion circuit electrically connected to the second filter circuit to receive the second processed signal and generate a binary signal.

12. The receiving circuit according to claim 11, further comprising:

a second amplifier connected between the first and second filter circuits; and a third amplifier connected to the second filter circuit.

13. The receiving circuit according to claim 11, wherein the first filter circuit includes a bypass circuit for attenuating the low frequency component or DC component of the voltage signal.

14. The receiving circuit according to claim 13, wherein the bypass circuit is an attenuator.

15. A receiving circuit comprising:

a first amplifier for converting a receiving current to a voltage signal;

a first filter circuit connected to the first amplifier to generate a first processed signal in accordance with the voltage signal, wherein the first processed signal includes a first component having an AC component of the voltage signal and a second component having a low frequency component or a DC component of the voltage signal;

a second filter circuit electrically connected to the first filter circuit, wherein the second filter circuit includes a high pass filter for receiving the first processed signal and generating a second processed signal;

a binary conversion circuit electrically connected to the second filter circuit to receive the second processed signal and generate a binary signal; and a DC component cancellation circuit connected between an input terminal and an output terminal of the first amplifier to eliminate an offset voltage from the voltage signal, wherein the cancellation circuit includes;

a voltage holding circuit for receiving the voltage signal and holding a peak voltage of the voltage signal; and a feedback amplifier connected to the voltage holding circuit, wherein the feedback amplifier compares the held peak voltage with a reference voltage and generates a feedback signal to eliminate the offset voltage, the feedback signal being provided to the input terminal of the first amplifier.

* * * * *